United States Patent [19]

Bernstein

[11] Patent Number: 5,399,969
[45] Date of Patent: Mar. 21, 1995

[54] ANALYZER OF GRADIENT POWER USAGE FOR OBLIQUE MRI IMAGING

[75] Inventor: Matthew A. Bernstein, Waukesha, Wis.

[73] Assignee: General Electric Company, Milwaukee, Wis.

[21] Appl. No.: 102,661

[22] Filed: Aug. 5, 1993

[51] Int. Cl.⁶ .............................................. G01V 3/00
[52] U.S. Cl. ................................. 324/309; 324/322; 324/312
[58] Field of Search ............... 324/307, 309, 312, 314, 324/318, 322; 128/653.5

[56] References Cited

U.S. PATENT DOCUMENTS

| | | | |
|---|---|---|---|
| 4,933,626 | 6/1990 | Halbach et al. | 324/309 |
| 5,066,914 | 11/1991 | Vavrek et al. | 324/309 |
| 5,068,786 | 11/1991 | Netter et al. | 324/309 |

OTHER PUBLICATIONS

Abstract of presentation given Nov. 28, 1989 at 75th Anniversary Scientific Assembly and Annual Meeting Radiological Society of North America, *Turbo MR Imaging: Increased Clinical Performance by Means of a Distributed Gradient Load* by William Sattin.

*Primary Examiner*—Louis Arana
*Attorney, Agent, or Firm*—Quarles & Brady

[57] ABSTRACT

A method for providing an indication of the limits of available functional gradient power when MRI equipment is used to obtain oblique MRI images calculates a "maximum absolute row sum" of a rotational matrix defining the degree obliquity of the image. This maximum absolute row sum provides one or more target functional gradient values based on the limitations of the physical gradients of the system.

6 Claims, 1 Drawing Sheet

ANALYZER OF GRADIENT POWER USAGE FOR OBLIQUE MRI IMAGING

BACKGROUND OF THE INVENTION

The field of the invention is magnetic resonance imaging (MRI) and, in particular, a system for analyzing gradient usage when oblique MRI images are obtained.

When human tissue is subjected to a polarizing magnetic field $B_0$, the individual magnetic moments of the spins in the tissue attempt to align with this polarizing field but precess about it at a Larmor frequency dependent principally on the magnetic field strength. The precession produces a resonance signal that may be detected and used to generate an image by imparting a spatially dependent phase and frequency to the spins through the use of superimposed and orthogonal gradient fields ($G_x$, $G_y$ and $G_z$).

The gradient fields are employed, individually or together, to first select a slice volume in which the spins are coherent by generating a functional "select" gradient $F_s$ in conjunction with an RF excitation. Second, within this slice, by means of a functional "frequency" gradient ($F_f$), the frequency of the spins is changed according to their location along the axis of the $F_f$ gradient. Finally, along an axis orthogonal to that of the $F_s$ and $F_f$ gradients, a progressively increasing functional "phase" gradient ($F_p$) is applied to vary the phase of the spins according to their location along that axis. The time sequence of data for a set of different phase encodings produces an array of data that when operated on by a two-dimensional Fourier transform yields an image of a slice through the patient. A basic overview of MRI image reconstruction is contained in the book "*Magnetic Resonance Imaging, Principles and Applications*" by D. N. Kean and M. A. Smith hereby incorporated by reference.

The functional gradients, $F_s$, $F_f$, and $F_p$, need not be aligned with the physical gradients, $G_x$, $G_y$ and $G_z$, but may be oriented arbitrarily by the simultaneous energization of the various physical gradients $G_x$, $G_y$ and $G_z$ whose vector sum can produce functional gradients along any arbitrary axis. When $F_s$, $F_f$, or $F_p$ are not aligned with any of the physical gradients $G_x$, $G_y$ or $G_z$, the image produced is termed "oblique". Oblique imaging is preferred for the study of certain parts of the body for diagnostic reasons.

As a general matter, it is desirable to be able to produce gradient fields with rapid rise and fall times ("high slew rate") and with high amplitude. Higher gradient slew rate generally allows shorter acquisitions of the necessary MRI signals. Higher amplitude gradient fields can also reduce the time required to obtain an MRI signal, for example, in conjunction with an increase of the bandwidth of the NMR receiver. Further, stronger gradient field also increase the spatial resolution of the imaging process permitting smaller voxels of a patient to be discerned. Generally, both the slew rate and amplitude of the gradients is determined by the maximum voltage and current of the gradient amplifiers powering the gradient coils.

In oblique imaging, the limitations of the gradient slew rate and amplitude are exacerbated by a need to limit the maximum value of functional gradient so that the physical gradients do not exceed their limits. The reason for this limitation is that a single physical gradient may be simultaneously called upon to provide components of two functional gradients and thus potentially be overtaxed. Accordingly, the peak functional gradients for oblique orientations are normally limited to be a fraction of the peak gradients that may be obtained for non-oblique views.

SUMMARY OF THE INVENTION

The present invention recognizes that although oblique imaging may be highly demanding of the physical gradients, a worst-case de-rating of the functional gradients results in less than optimal utilization of the MRI equipment. Accordingly, the present invention provides both a method of more precisely indicating the limits that need to be imposed on the functional gradients for oblique imaging, based on the operator prescribed angulation and on some simple assumptions about gradient usage.

Specifically, the operator selected orientation between the functional gradient axes and physical gradient axes may be described by an orthogonal rotation matrix. The present invention employs the electronic computer used for controlling the MRI gradient pulse sequence to determine a "maximum absolute row sum" of the orthogonal rotation matrix. This maximum absolute row sum is simply the maximum of a set of sums produced when the absolute values of the elements or selected elements of each row of the rotation matrix are summed together and compared. A target amplitude T is then produced by dividing the amplitude limit of the physical gradients, h, by the maximum absolute row sum. This target amplitude is used to provide an indication to the operator of the limits of the functional gradients.

Thus, it is one object of the invention to provide a simple and rapid method of more accurately determining the amount of the de-rating of the functional gradients needed for an oblique image. If the angular displacement between the oblique image and the physical gradient axes is small, the maximum absolute row sum will be close to one and much less than a worst case de-rating will be required.

In one embodiment, if any column of the rotational matrix includes a value of one, the target amplitude for the functional gradient associated with that column is set equal to the maximum physical gradient value notwithstanding the maximum absolute row sum. This reflects a special case where one physical axis exactly corresponds with one functional axis and therefore no de-rating is required. Further, the target gradient amplitudes for the remaining two functional axes are calculated with maximum absolute row sums that do not include matrix elements from the column that includes the value of one.

The above technique is simple and efficient and requires no knowledge of the actual pulse sequence. It is assumed that multiple pulses along different functional axes may be activated simultaneously and that the peak gradient h is the same for all physical axes.

Other objects and advantages will be apparent to those experienced in the art from the description of a preferred embodiment of the invention which follows. In the description, reference is made to the accompanying drawings, which form a part hereof, and which illustrate one example of the invention. Such example, however, is not exhaustive of the various alternative forms of the invention, and therefore reference is made to the claims which follow the description for determining the scope of the invention.

DETAILED DESCRIPTION OF THE PREFERRED EMBODIMENT

Figure 1:
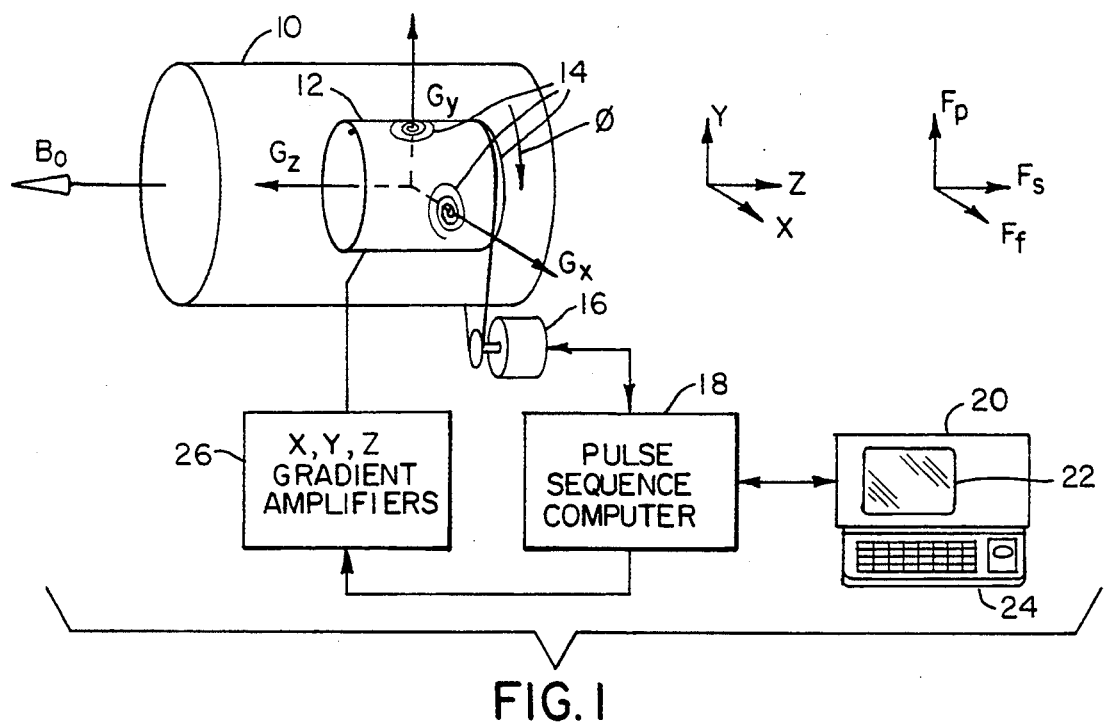
FIG. 1 is a simplified geometric representation of an MRI system showing a magnet bore and a gradient coil assembly fitted for rotation about the axis of the magnet bore and showing the coordinates of the physical gradient axes $G_x$, $G_y$ and $G_z$ as distinguished from the coordinates of the functional gradient axes $F_s$, $F_f$, and $F_p$.

Referring to FIG. 1, an MRI system includes a magnet bore 10 for defining a generally cylindrical volume having a uniform magnetic polarizing field $B_0$ oriented along the axis of the magnetic bore 10 and the z-axis of a Cartesian coordinate system. Concentrically contained within the bore 10 is a cylindrical coil form 12 supporting on its surface coil windings 14 which establish three orthogonal physical gradients $G_x$, $G_y$ and $G_z$.

The coil form 12 may be rotated about the z-axis by motor/encoder 16 so that the physical axes of gradients $G_x$ and $G_y$ may be angularly swept by an angle $\phi$. The motor/encoder 16 is controlled by a pulse sequence computer 18 which provides signals to the motor/encoder 16 for moving the gradient coil form 12 (and hence the physical gradients $G_x$ and $G_y$). The motor/encoder 16 also provides to the pulse sequence computer 18 a feedback angle signal for confirmation of the rotation.

The pulse sequence computer 18 stores gradient pulse sequences used for controlling the gradient fields $G_x$, $G_y$ and $G_z$ during the MRI pulse sequence, such sequences being defined by the operator through means of a terminal 20 connected to the pulse sequence computer 18. The terminal 20 also provides a display 22 and keyboard 24 allowing output and input from and to the pulse sequence computer 18. The pulse sequence computer 18 communicates with gradient amplifiers 26 and provides the latter with digitized values indicating the pulse sequence. These digitized values are received by the gradient amplifiers 26 and converted to actual gradient currents for driving the coil windings 14 on the coil form 12 to produce the desired gradient fields.

As described previously, the physical gradients along gradient axes $G_x$, $G_y$ and $G_z$ may be utilized to select and image a slice through a patient located within the coil form 12. For example, in axial, non-oblique imaging, the slice plane is parallel to the x-y plane and the phase and frequency encoding can be taken along the x and y directions, respectively, with the physical gradient axes $G_x$, $G_y$ being aligned with those respective axes of the coordinate.

For oblique imaging, the imaged slice is not parallel to the x-y, y-z, or x-z planes but instead is parallel to a plane normal to the axis of gradient $F_s$. In this case, the phase encoding is along functional axis $F_p$ and the frequency encoding is along functional axis $F_f$. Generally, the orthogonal set of functional axes $F_s$, $F_f$ and $F_p$ may be at any angular orientation with respect to the physical axes $G_x$, $G_y$ and $G_z$.

Figure 2:
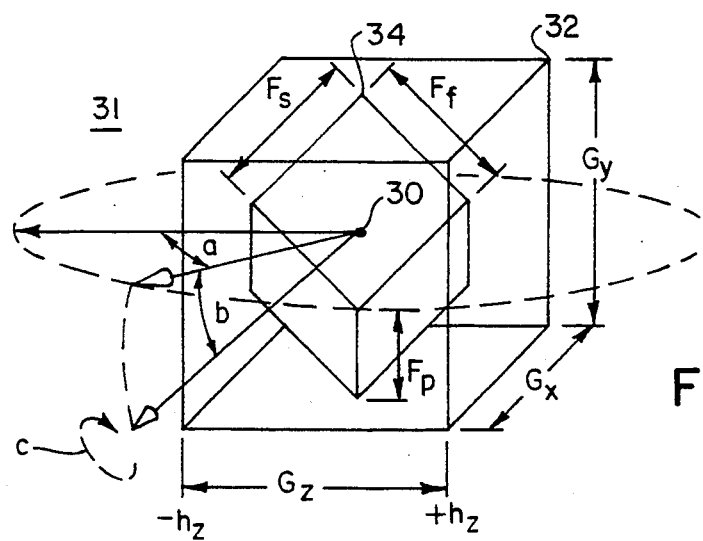
FIG. 2 is a geometric representation of the de-rating of functional gradients as determined by their rotational orientations with respect to physical gradients.

Referring now to FIG. 2, the angular relationship between the orientation of the functional axes $F_s$, $F_f$ and $F_p$ and the physical axes $G_x$, $G_y$ and $G_z$ may be defined by three rotational angles a, b and c about an origin point 30. For example, angle a may be generally an angular rotation about the origin 30 and the axis of gradient $F_s$, angle b may be angular rotation succeeding angle a about the origin 30 and the axis of $F_f$, and angle c may be an angular rotation about origin 30 and the axis of $F_s$. Other angular schemes having three variables also may be used. See for example, *Quantum Mechanics*, Vol. 3, Chapter 13, Section 3.10 by A. Messiah published by John Wileys & Sons, New York, 1978 hereby incorporated by reference.

Any rotation about origin 30 may be described by a 3×3 orthogonal rotation matrix that may be parameterized by three Euler angles according to any of several conventions as described above. The three Euler angles define a 3×3 orthogonal rotation matrix.

Thus, the relationship between the physical gradients and the functional gradients may be defined by the following matrix multiplication of the functional gradients times the rotation matrix.

$$\begin{bmatrix} G_x \\ G_y \\ G_z \end{bmatrix} = \begin{bmatrix} b_{Xf} & b_{Xp} & b_{Xs} \\ b_{Yf} & b_{Yp} & b_{Ys} \\ b_{Zf} & b_{Zp} & b_{Zs} \end{bmatrix} \begin{bmatrix} F_f \\ F_p \\ F_s \end{bmatrix} \quad (1)$$

The factor $$\begin{bmatrix} b_{Xf} & b_{Xp} & b_{Xs} \\ b_{Yf} & b_{Yp} & b_{Ys} \\ b_{Zf} & b_{Zp} & b_{Zs} \end{bmatrix}$$

in equation (1) is the rotation matrix and has rows corresponding to each of the physical gradients, $G_x$, $G_y$ and $G_z$, and columns corresponding to each of the functional gradients, $F_s$, $F_f$, and $F_p$, as follows the pattern of normal matrix multiplication, and as will be referred to later. The correspondence of the rows and columns to physical and functional gradients has been indicated by the subscript of the elements of the rotational matrix. Thus, the elements b in the first column all have subscripts 'f' indicating they are associated with the frequency encoding gradient $F_f$.

Equation (1) provides a conversion between the functional gradients and the physical gradients which may be thought of as a mapping from a three-dimensional functional gradient space to a three-dimensional functional gradient space 31. The three-dimensional physical gradient space holds a gradient envelope 32 which is a rectangular prism having edges aligned with the axes of the physical gradients and of length equal to the maximum range of each physical gradient. Thus, if each physical gradient may range between a value of ±h, the physical gradient envelope 32 is a cube. Values of the functional gradients $F_s$, $F_f$ and $F_p$ may be mapped to the physical gradient space through the transformation indicated by equation (1) above.

The functional gradient values $F_s$, $F_f$ and $F_p$ of the gradient pulse sequence are achievable only if they fall, after this mapping process, within the physical gradient envelope 32. Thus, generally as shown in FIG. 2, for an oblique image, the limits of the functional gradient values will be less than those of the physical gradients. For example, if the functional gradients are exercised simultaneously and are assumed to have equal maximum values, the functional gradients may be represented by a smaller cube of functional gradient boundary 34 tipped within the physical gradient envelope 32. If the functional gradients $F_s$, $F_f$ and $F_p$ are given the worst case rotation (where each element in the rotation matrix has absolute value $=\frac{1}{\sqrt{3}}$) the length of each side of the functional gradient boundary 34 will be $\frac{1}{\sqrt{3}}$ times the actual limit of the physical gradients of h. This geometrical insight may be made more precise by returning to the matrix model. That is defining targets beyond which the respective functional gradients $F_f$, $F_p$ and $F_s$ may not extend as follows:

$$T_s = T_f = T_p = T \tag{2}$$

This choice of equal target amplitudes is logical when there is no prior knowledge about the gradient waveforms except that they may be simultaneously active. Equations (1) and (2) yield $$\left| \begin{bmatrix} b_{Xf} & b_{Xp} & b_{Xs} \\ b_{Yf} & b_{Yp} & b_{Ys} \\ b_{Zf} & b_{Zp} & b_{Zs} \end{bmatrix} \begin{bmatrix} \pm T_s \\ \pm T_f \\ \pm T_p \end{bmatrix} \right| = \left| \begin{bmatrix} \pm b_{Xf} & \pm b_{Xp} & \pm b_{Xs} \\ \pm b_{Yf} & \pm b_{Yp} & \pm b_{Ys} \\ \pm b_{Zf} & \pm b_{Zp} & \pm b_{Zs} \end{bmatrix} \right| \tag{3}$$

$$T \le \begin{bmatrix} h \\ h \\ h \end{bmatrix}$$

Thus a feasible value for the target gradient amplitudes T can be extracted from equation (3), $$T = h/\max\{|b_{Xf}| + |b_{Xp}| + |b_{Xs}|; |b_{Yf}| + |b_{Yp}| + |b_{Ys}|; |b_{Zf}| + |b_{Zp}| + |b_{Zs}|\}) \tag{4}$$

Where max{} takes the maximum elements within the brackets. The denominator of equation (4) will be termed the maximum absolute row sum or MARS. This calculation of MARS provides a simple method of de-rating the maximum value of the functional axes according to the oblique angle as defined by the orthogonal rotation matrix.

If the three physical gradient limits differ, then denote their limits by $h_x$, $h_y$, and $h_z$. In this case equation (4) is replaced by equation (4′).

$$T = \min \{h_x/(|b_{Xf}| + |b_{Xp}| + |b_{Xs}|); h_y/(|b_{Yf}| + |b_{Yp}| + |b_{Ys}|); h_z/(|b_{Zf}| + |b_{Zp}| + |b_{Zs}|)\} \tag{4'}$$

where min {} takes the minimum of the elements in the brackets.

Note that this procedure is useful for both oblique and non-oblique MRI images.

Generally, if the degree of obliquity of the image is small, the de-rating will be less. On the other hand, at the maximum obliquity as illustrated by FIG. 2, the maximum value of the functional gradients will be much reduced. Generally, the target value T will be used by the pulse sequence computer 18 to provide to the operator with limits in terms of field of view, spatial resolution, slice thickness or acquisition time. The relationship between gradient slew rate and amplitude and the above factors is well known in the art. Alternatively, the value T may be directly displayed.

Special Case Where Some Gradients Are Dormant

If one or more of the functional gradients, $F_s$, $F_f$, and $F_p$, are dormant during the pulse sequence (or an interval of interest) then equation (4) may be simplified because of the effective the loss of contribution from the column of the rotational matrix of equation (3) corresponding to that dormant gradient. For example, if the phase encoding gradient $F_p$ is dormant, equation (4) becomes:

$$T = h/\max\{|b_{Xf}| + |b_{Xs}|; |b_{Yf}| + |b_{Ys}|; |b_{Zf}| + |b_{Zs}|\}) \tag{5}$$

Likewise, if, for example, the frequency encode gradient, $F_f$, is the sole active gradient, equation (4) becomes:

$$T = h/\max\{|b_{Xf}|; |b_{Yf}|; |b_{Zf}|\}) \tag{6}$$

Analogous results hold for the other axes.

Special Case Where Functional Gradients Are "Unmixed"

If the rotation of the functional gradients, $F_s$, $F_f$, and $F_p$, with respect to the physical gradients, $G_x$, $G_y$ and $G_z$, is such that any column of the rotational matrix includes a one or negative one (and hence also two zeros) the gradient associated with that column is considered "unmixed". This unmixed gradient may occur, for example, if the functional gradients, $F_s$, $F_f$, and $F_p$, are simply the physical gradients, $G_x$, $G_y$ and $G_z$, rotated about the $G_z$ axis. Here, the functional gradient $F_s$ is unmixed with the other functional gradients $F_f$ and $F_p$ and the third column of the rotational matrix will have a one (or negative one) and two zeros.

The unmixed gradient may be employed at a full strength equal to the maximum amplitude of the physical gradient with which it is aligned. On the other hand, the remaining two gradients need only be limited as required by a MARS calculated without the column of the unmixed gradient. For example, if the phase encoding gradient $F_p$ is aligned with the physical gradient $G_y$ then the equation (4) reduces to:

$$T_p = h \tag{7}$$

and $$T_s = T_f = h/\max\{|b_{Xf}| + |b_{Xs}|; |b_{Yf}| + |b_{Ys}|; |b_{Zf}| + |b_{Zs}|\}) \tag{8}$$

Analogous results hold for the other axes.

Note that if one of the "mixed" axes is dormant, the above rules also permit the column of the dormant axes to be omitted in the MARS calculations. So, for example, if the slice select axis $F_s$ in the example of equation (8) were dormant, then equation (8) would become $$T_f = h/\max\{|b_{Xf}|; |b_{Yf}|; |b_{Zf}|\}) \tag{8}$$

Figure 3:
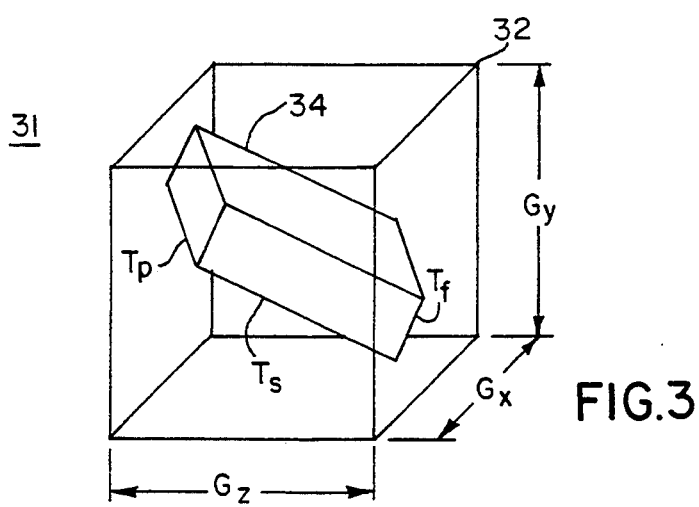
FIG. 3 is a Figure similar to FIG. 2 for functional gradients of different peak values.

Referring now to FIG. 3, the assumption that each of the functional gradients has the same amplitude limit is not always true and results in a overly conservative de-rating of the functional gradients in certain circumstances. For example, if one functional gradient dominates the other two, the functional gradient boundary 34 need not be a cube but may be a slender rectangular prism. In the limiting case where only one functional gradient is active, the functional gradient boundary 34 becomes a single line segment.

For this reason, a more detailed analysis of the gradient pulse sequence may be performed in which the amplitude of two of the smaller gradients are designated and a target limit is computed for the third gradient. Or, in the two dimensional case, only the single smallest gradient may be designated and the target limit for the remaining mixed gradient may be determined.

The insight of the present invention, of modeling the functional gradients as a rectangular prism fitting in the rectangular prism defined by the physical gradients, enables a target T to be readily determined for any independent single functional axis $F_s$, $F_f$, $F_p$ in either of these situations by the iterative process of expanding a single undefined dimension of the functional gradient prism 34 represented by T with the prism 34 oriented as dictated by the rotational matrix until one vertex of the prism 34 first protrudes from the rectangular prism of gradient envelope 32 defined by of the physical gradients $G_x$, $G_y$ and $G_z$. The length of this expanded dimension is then the target for that functional gradient. For example, if it is known that the amplitude limits of functional gradients $F_f$ and $F_p$ are $T_f$ and $T_p$ respectively, then a rectangular prism of functional gradient boundary 34 may be modeled having axis oriented as dictated by the rotational matrix and with dimensions $T_s$, $T_f$ and $T_p$ where $T_s$ is initially zero. The vertices of the prism of functional gradient boundary 34 may be tested to ensure that they remain within the prism of gradient envelope 32 and if so, $T_s$ may be incremented slightly and this test repeated. Once any vertex of the prism of functional gradient boundary 34 extends outside of prism of gradient envelope 32 the iteration stops and the limit of $T_s$ is taken as its then current value.

When only two dimensions need be considered, for example, because the rotation matrix contains a one or a negative one, the rectangular prisms of gradient envelope and 32 and functional gradient boundary 34 may be replaced with equivalent rectangles, thus simplifying the test.

Note that in this embodiment, the physical gradient envelope 32 need not be a cube but may reflect possible differences in the amplitudes of the physical gradients. In any case, determination of whether a vertex point 40 is within the envelope 32 or not is a simple thresholding process with respect to the three coordinates corresponding to the three gradients $G_z$, $G_x$, and $G_y$.

In order to apprise the public of the various embodiments that may fall within the scope of the invention, the following claims are made.

I claim:

1. A method of automatically determining the limits of a gradient pulse sequence defined along at least two functional gradient axes and stored in an electronic computer in an MRI system having at least two orthogonal gradient coils along physical gradient axes each having a maximum gradient amplitude of h, functional gradient axes being used to acquire an oblique MRI image, and angled with respect to the physical gradient axes as defined by an orthogonal rotation matrix also stored in the electronic computer, the method comprising the steps of:
    employing the electronic computer to
    (a) determine the maximum absolute row sum of the orthogonal rotation matrix;
    (b) produce a target amplitude T by dividing the maximum gradient amplitude h by the maximum absolute row sum; and
    (c) employing T to indicate the maximum gradients along the functional gradient axes as may be manifest in limits of: field of view, slice thickness, spatial resolution and acquisition time.

2. The method of claim 1 including the step of:
    employing the electronic computer to:
    identify any column of the rotational matrix including a value of magnitude equal to one; and
    set the target amplitude T to h for a gradient corresponding to that column, notwithstanding step (b).

3. The method of claim 2 wherein the column of the rotational matrix including a value of magnitude equal to one is excluded from the calculations of the maximum absolute row sum for the target value.

4. The method of claim 1 including the step of employing the electronic computer to:
    identify any of the functional gradient axis not employed by the gradient pulse sequence;
    in step (a) calculating the maximum absolute row sum of the orthogonal rotational matrix omitting any column of the matrix corresponding to the functional gradient axes not employed.

5. A method of automatically determining the limits of a gradient pulse sequence defined along at least two functional gradient axes and stored in an electronic computer in an MRI system having at least three orthogonal gradient coils along physical gradient axes each having a maximum gradient amplitude of $h_x$, $h_y$, and $h_z$, respectively, the functional gradient axes being used to acquire an MRI image, and oriented with respect to the physical gradient axes as defined by an orthogonal rotation matrix also stored in the electronic computer, the method comprising the steps of:
    employing the electronic computer to
    (a) determine the absolute row sum of each row of the orthogonal rotation matrix;
    (b) produce a target amplitude T equal to the minimum of each maximum gradient amplitude $h_x$, $h_y$, $h_z$ divided by a corresponding absolute row sum from step (a); and
    (c) employing T to indicate the maximum gradients along the functional gradient axes as may be manifest in limits of: field of view, slice thickness, spatial resolution and acquisition time.

6. A method of automatically determining the limits of a gradient pulse sequence defined along at least two functional gradient axes and stored in an electronic computer in an MRI system having at least two orthogonal gradient coils along physical gradient axes each having a maximum gradient amplitudes, functional gradient axes being used to acquire an oblique MRI image, and angled with respect to the physical gradient axes as defined by an orthogonal rotation matrix also stored in the electronic computer, the method comprising the steps of:
    employing the electronic computer to
    (a) solicit an amplitude limit of one functional gradient $T_x$;
    (b) model a rectangular form having at least two dimensions where one dimensions is $T_x$ and having an axis rotated according to the orthogonal rotational matrix;
    (c) set the second dimension equal to a test dimension $T_y$;
    (d) test vertices of the rectangular form against limits defined by the physical gradients;
    (e) increase incrementally the dimension $T_y$ if the vertices of the rectangular form are within the limits defined by the physical gradients and repeat steps (b)-(e); and
    (f) otherwise employing $T_y$ to determine maximum gradients along the functional gradient axes.

* * * * *